United States Patent [19]

Rostamian

[11] Patent Number: 5,572,721
[45] Date of Patent: Nov. 5, 1996

[54] HIGH SPEED SERIAL INTERFACE BETWEEN IMAGE ENHANCEMENT LOGIC AND ROS FOR IMPLEMENTATION OF IMAGE ENHANCEMENT ALGORITHMS

[75] Inventor: Farhad Rostamian, Los Angeles, Calif.

[73] Assignee: Xerox Corporation, Stamford, Conn.

[21] Appl. No.: 355,374

[22] Filed: Dec. 13, 1994

[51] Int. Cl.⁶ .............................. G06F 1/04; G06F 9/315
[52] U.S. Cl. ............................................ 395/555; 395/891
[58] Field of Search ....................................... 395/550, 891

[56] References Cited

U.S. PATENT DOCUMENTS

| | | | |
|---|---|---|---|
| 4,378,593 | 3/1983 | Yamamoto | 364/900 |
| 5,122,679 | 6/1992 | Ishii et al. | 307/269 |
| 5,457,718 | 10/1995 | Anderson et al. | 375/373 |

OTHER PUBLICATIONS

Digital Phased Locked Loop Application Note, Texas Instruments pp. B–1 to B–9 publication date unknown.

*Primary Examiner*—Thomas M. Heckler
*Assistant Examiner*—Dennis M. Butler
*Attorney, Agent, or Firm*—Robert Cunha

[57] ABSTRACT

This circuit for serializing n parallel data bits requires that the data clock, having a clock period T, be used to generate n phased clocks of the same frequency as the data clock, but varying in phase such that each phased clock is delayed T/n with respect to the previous one. This can be done using a digital phase locked loop device. These n phased clocks and n parallel data bits are then input to a logic circuit which uses an n input Register and an n input multiplexer to output one data bit for each phased clock. The result is a serializer that converts parallel data to serial data without the need for generating a higher frequency clock.

2 Claims, 3 Drawing Sheets

HIGH SPEED SERIAL INTERFACE BETWEEN IMAGE ENHANCEMENT LOGIC AND ROS FOR IMPLEMENTATION OF IMAGE ENHANCEMENT ALGORITHMS

BACKGROUND OF THE INVENTION

This is a circuit for converting parallel binary bits per clock cycle into serial bits per clock cycle, and more specifically is a circuit comprising a digital phase locked loop, counters, registers and a multiplexer for accomplishing this conversion.

There is a common need in the industry for the conversion of parallel to serial data streams. For example, it is common for an image generating circuit to process image data in the form of a number of bits per word in parallel, but to convert this image data into serial bits for printing on a raster output scanner (ROS). To use a numerical example, if the image data words are eight bits, then these words could be loaded in parallel into an eight bit register by using a system clock, and clocked out serially to the ROS using a clock with a frequency eight times higher than the system clock. The higher frequency clock can be produced using a phase lock loop. The main problem with this system is that the higher frequency clock may be difficult to produce and control since special high-frequency components may be required in the circuit. Current methods of meeting this requirement usually rely on analog techniques and multiplication of the original clock to higher frequencies which require very selective discrete components and very careful layout and electromagnetic emissions protections. One particular device (Model AD9560 Pulse Width Modulator from Analog Devices) has the limitation that only certain high addressability codes are allowed. A method of converting parallel data to serial data without the use of a higher frequency clock is needed.

SUMMARY OF THE INVENTION

This invention accomplishes this conversion by using a digital phase locked loop to generate new clocks which have the same frequency as the original system clock, but that differ in phase. These new clocks can then be used to gate (shift) out the data serially, without the need for higher frequency clocks. A numerical example, using four clocks, can be used to explain the conversion.

A digital phase locked loop is set up to generate a stabilized clock from the system clock which is locked to the system clock with some jitter accuracy; this locked clock becomes phase 1, and to determine the time period T for this clock frequency. The phase 1 clock is delayed by T/4 to create phase 2. Phase 1 is inverted to create phase 3 and phase 2 is inverted to create phase 4. The four phases are now used to gate the four bits to the four data inputs of a multiplexer, and phase 1 and 2 are used as inputs to the two multiplexer control lines. The result is that the output of the multiplexer during one clock period (T) will be the four input bits in series.

This circuit is useful in image enhancement applications where each image generator output bit (each pixel of the bitmap) is presented to an image enhancement circuit, which generates a number of parallel output bits for each input bit. These must then be serialized prior to being sent to the ROS (raster output scanner). Copending U.S. patent application Ser. No. 08/173,015 describes such a system, and is incorporated herein by reference.

This invention offers a solution to the high speed data serialization problem associated with the hardware implementation of image enhancement algorithms (dilation, appearance tuning, edge enhancement, etc). The problem arises because through image enhancement, the single-bit pixel becomes algorithmically enhanced into a multi-bit pixel (usually 4 or 5 bits per pixel) and therefore 4 or 5 times as much information needs to be serially sent to the ROS in the same pixel clock cycle. For example, for a 50 MHz base pixel clock and 5 bits of high addressability, the effective data transfer rate from image enhancement logic to ROS will be 250 mega-bits per second (Mb/S) on a serial interface.

The technique presented here relies on a digital phase locked loop and multiple phase generation of the base clock and thus avoids the generation of higher frequency clocks. Also, all possible combinations of high addressability codes (e.g. all $2^4$ or $2^5$ combinations of bits) can be processed by this design. Further, this technique can be designed as a stand alone ASIC (application specific integrated circuit) device, or can be easily integrated into an image enhancement ASIC whose main function is template matching and selection as in said incorporated application.

DETAILED DESCRIPTION OF THE INVENTION

Figure 1:
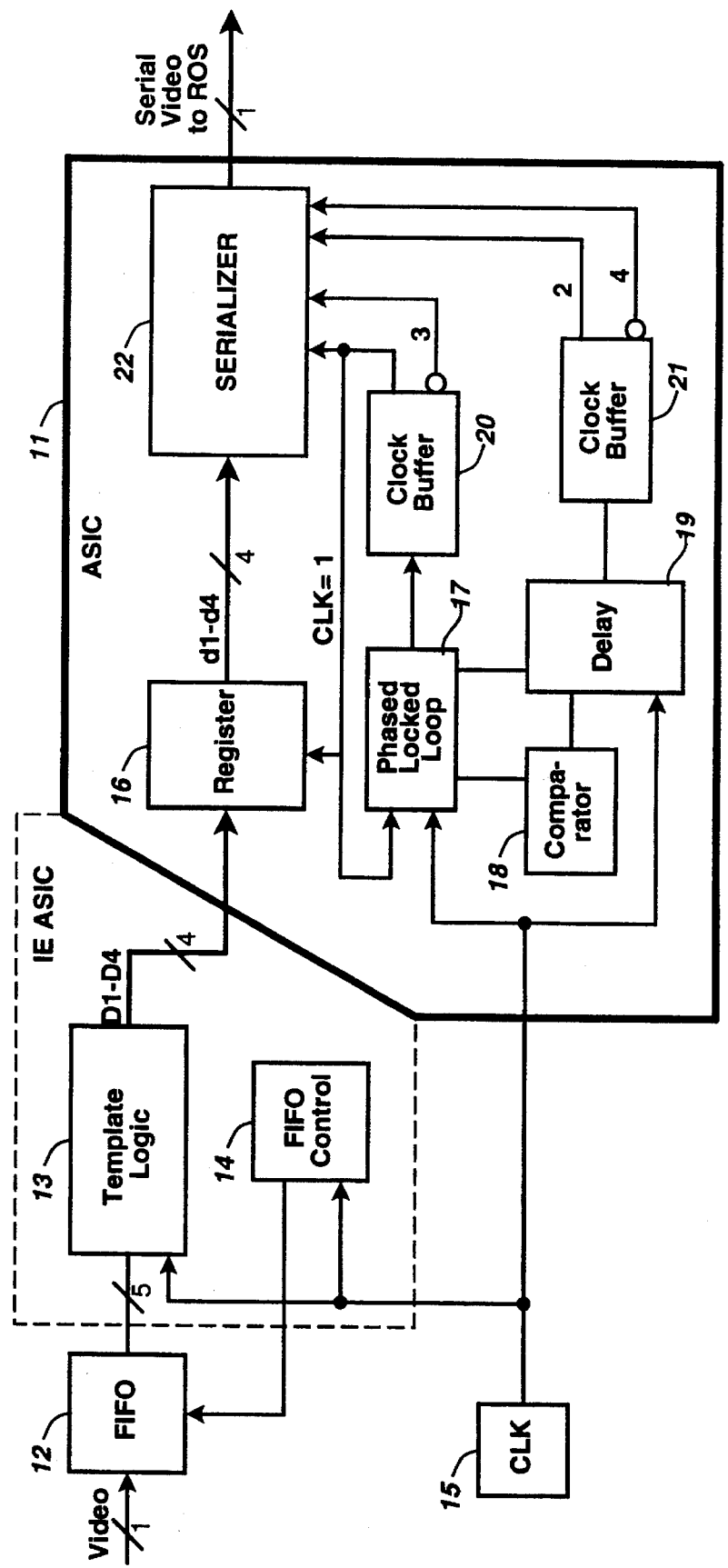
FIG. 1 is a block diagram of an image enhancement circuit using this invention.

FIG. 1 illustrates the basic block diagram and data flow for an ASIC (application specific integrated circuit) implementation of an image enhancement algorithm using the parallel to serial interface. In all cases the examples are shown using 4 data bits per clock period and 4 clock phases, but any other number could be used. Using current processes, this circuit can be fabricated using CMOS (complementary metal-oxide semiconductor) technology for output data rates of up to 200 Mb/s (for 0.8 micron CMOS technology) to the ROS, or BiCMOS technology for higher data rates The image data from the image generation circuits (e.g. the bitmap) are shown arriving at the FIFO 12 which stores them and then supplies them 5 (5 or 7 or 9) bits at a time, in this numerical example, to the image enhancement ASIC, which is described in detail in the incorporated patent application. For the purposes of this description, let us assume that the template logic 13 creates a 5×5 bit window from the input bits, compares the result to a number of templates, and generates a 4-bit output for each system clock received from the clock generator 15. The other part of the image enhancement ASIC is the FIFO control 14 which controls the FIFO 12 to output data to the template logic 13.

The system clock and the template logic output data, D1–D4, are supplied to the conversion logic 11 which must now serialize the 4 bits of output data.

For timing purposes, the original data D1–D4 is latched through register 16 to become data d1–d4, prior to being applied to the serializer 22.

The phase locked loop 20 receives the system clock and outputs an identical clock to the buffer 20 which generates the inverse and applies both to serializer 22 as phases 1 and 3.

The delay circuit 19 receives the phase 1 clock output from the phase lock loop and delays it by a quarter of a period to create, through buffer 21, phases 2 and 4. To the extent that the delay may be slightly more or less than a quarter of a clock period, the delay is compared to a quarter of a clock period timing signal from the phase locked loop in a feedback loop, and a correction is applied to the delay if necessary.

Figure 2:
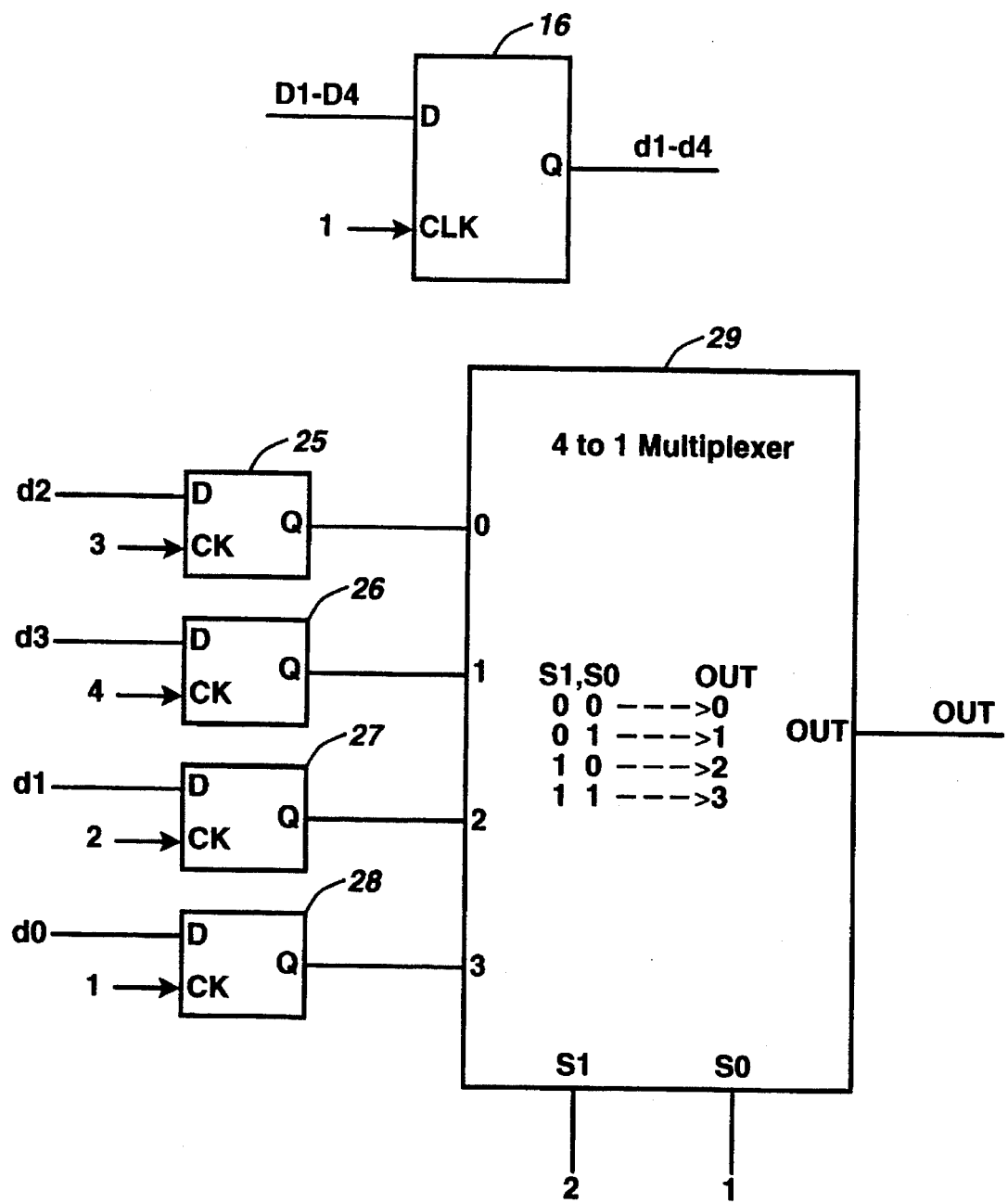
FIG. 2 is a circuit diagram showing the multiplexer which serializes the data.
Figure 3:
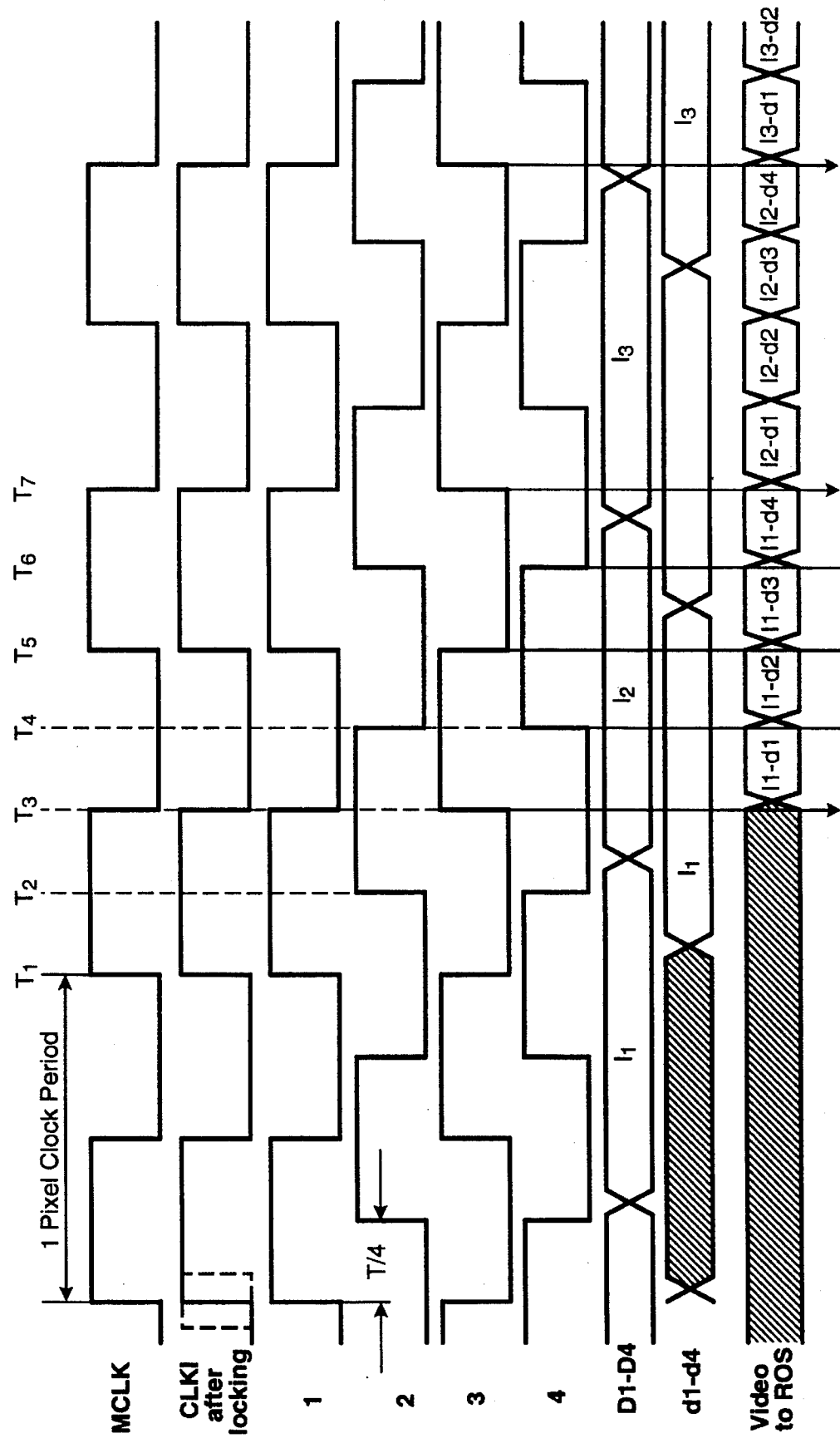
FIG. 3 is a timing diagram.

The relative timing of the various signals can be explained with reference to the circuit of FIG. 2 and the timing diagram of FIG. 3. The master clock, MCLK, received from the system clock generator 15, is applied to the digital phase locked loop 17, which generates an identical clock (which is locked to the input clock MCLK) at its output, CLK1, which is also used as the phase 1 clock. The buffer 20 also inverts this and produces the phase 3 clock. Delay 19 produces a clock delayed by a quarter of the time period of the clock to produce phase 2 and buffer 21 inverts that to produce phase 4.

Assuming that the first set of enhanced image data bits is at lines D1–D4 as shown, then at T1, at the time of the rising edge of the phase 1 clock, that data will be clocked onto the d1–d4 lines. At T2, the phase 2 clock goes high, clocking the d1 bit into flip flop 25 of FIG. 2. However, although this data is now available at the output of flip flop 25, the control lines of the multiplexer, phase 1 and phase 2, at this point are still 11. It is only at T3, when phase 1 goes to zero, and that the data will propagate through the multiplexer as the output, as shown on the timing diagram, which shows I1-d1 being output starting at T3. By the same reasoning, I1-d2 is output beginning at T4, I1-d3 is output at T5, etc.

These timing relationships can be described more compactly as follows.

d1: sample with phase 2, send out with phase 3.
d2: sample with phase 3, send out with phase 4.
d3: sample with phase 4, send out with phase 1.
d4: sample with phase 1, send out with phase 2.

The result is a circuit that will serialize data without the requirement of a higher frequency clock pulse generator.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A circuit for receiving an input clock pulse, the time between input clock pulses being the time T, and n data bits per input clock pulse in parallel on n data lines, and for outputting said n data bits serially on a single output data line at the rate of n bits per input clock pulse, comprising:

means comprising a phased locked loop responsive to said input clock pulse for generating n output clocks, each output clock delayed T/n from the previous output clock, and means responsive to said n data bits and said n output clocks for outputting one data bit for each output clock.

2. A circuit for receiving an input clock pulse, the time between input clock pulses being the time T, and n data bits per input clock pulse in parallel on n data lines, and for outputting said n data bits serially on a single output data line at the rate of n bits per input clock pulse, comprising:

means comprising a phased locked loop responsive to said input clock pulse for generating n output clocks, each output clock delayed xT/n from the previous output clock (where x is any positive integer and where xT is an amount of delay with respect to the reference clock), and means responsive to said n data bits and said n output clocks for outputting one data bit for each output clock.

* * * * *